(12) United States Patent
Bakken

(10) Patent No.: US 9,252,915 B1
(45) Date of Patent: Feb. 2, 2016

(54) SYSTEMATIC ADAPTATION OF DATA DELIVERY

(71) Applicant: Washington State University Research Foundation, Pullman, WA (US)

(72) Inventor: David Edward Bakken, Pullman, WA (US)

(73) Assignee: Washington State University, Pullman, WA (US)

( * ) Notice: Subject to any disclaimer, the term of this patent is extended or adjusted under 35 U.S.C. 154(b) by 157 days.

(21) Appl. No.: 13/967,015

(22) Filed: Aug. 14, 2013

Related U.S. Application Data

(60) Provisional application No. 61/683,616, filed on Aug. 15, 2012.

(51) Int. Cl.
*G01R 31/08* (2006.01)
*H04L 1/00* (2006.01)
*G06Q 50/06* (2012.01)

(52) U.S. Cl.
CPC ............. *H04L 1/0002* (2013.01); *G01R 31/08* (2013.01); *G06Q 50/06* (2013.01)

(58) Field of Classification Search
CPC .............................. H04L 12/185; H04L 45/24
See application file for complete search history.

(56) References Cited

U.S. PATENT DOCUMENTS

| | | | |
|---|---|---|---|
| 8,041,772 B2* | 10/2011 | Amanuddin et al. | 709/208 |
| 8,351,433 B2* | 1/2013 | Morris et al. | 370/392 |
| 8,429,630 B2* | 4/2013 | Nickolov et al. | 717/148 |
| 8,489,722 B2* | 7/2013 | Karenos et al. | 709/223 |
| 8,509,953 B2* | 8/2013 | Taft | G01D 4/002 700/286 |
| 8,527,622 B2* | 9/2013 | Moreira Sa de Souza | 709/224 |
| 8,675,654 B2* | 3/2014 | Taft et al. | 370/390 |
| 8,677,464 B2* | 3/2014 | Smith et al. | 726/6 |
| 8,751,644 B2* | 6/2014 | Bornhoevd et al. | 709/224 |
| 8,806,239 B2* | 8/2014 | Forbes, Jr. | G01D 4/004 700/22 |
| 8,824,471 B2* | 9/2014 | Hui et al. | 370/390 |
| 8,867,345 B2* | 10/2014 | Morris et al. | 370/230 |
| 8,872,667 B2* | 10/2014 | Bhageria et al. | 340/635 |
| 8,885,516 B2* | 11/2014 | Rourke et al. | 370/254 |

(Continued)

OTHER PUBLICATIONS

Bakken et al., "Smart Generation and Transmission With Coherent, Real-Time Data", Proceedings of the IEEE, vol. 99, No. 6, Jun. 2011.*

*Primary Examiner* — Brian O'Connor
(74) *Attorney, Agent, or Firm* — Liang IP, PLLC

(57) ABSTRACT

This disclosure describes, in part, a system management component for use in a power grid data network to systematically adjust the quality of service of data published by publishers and subscribed to by subscribers within the network. In one implementation, subscribers may identify a desired data rate, a minimum acceptable data rate, desired latency, minimum acceptable latency and a priority for each subscription and the system management component may adjust the data rates in real-time to ensure that the power grid data network does not become overloaded and/or fail. In one example, subscriptions with lower priorities may have their quality of service adjusted before subscriptions with higher priorities. In each instance, the quality of service may be maintained, even if reduced, to meet or exceed the minimum acceptable quality of service for the subscription.

27 Claims, 11 Drawing Sheets

(56) References Cited

U.S. PATENT DOCUMENTS

| | | | | |
|---|---|---|---|---|
| 8,890,505 | B2 * | 11/2014 | Forbes, Jr. | G06Q 10/00 323/299 |
| 8,892,375 | B2 * | 11/2014 | Taft | 702/58 |
| 8,929,391 | B2 * | 1/2015 | Smith et al. | 370/466 |
| 8,941,372 | B2 * | 1/2015 | Gadiraju et al. | 324/103 R |
| 2011/0294456 | A1 * | 12/2011 | Anderson et al. | 455/404.1 |
| 2012/0082048 | A1 * | 4/2012 | Taft et al. | 370/252 |
| 2012/0082159 | A1 * | 4/2012 | Taft et al. | 370/390 |
| 2012/0191856 | A1 * | 7/2012 | Chen | G06F 9/5083 709/226 |

\* cited by examiner

| Publisher | Data | Publish Rate | Subscriber | Priority (1-5) | Desired Data Rate | Minimum Data Rate | Desired Latency | Minimum Latency | Desired Data Paths | Minimum Data Paths |
|---|---|---|---|---|---|---|---|---|---|---|
| P1 | X | 60 Hz | System | 1 | | | | | | |
| | | | S1 | 1 | 60 Hz | 20 Hz | 0-10 ms | 0-15 ms | 3 | 2 |
| | | | S2 | 1 | 50 Hz | 20 Hz | 0-15 ms | 0-20 ms | 3 | 2 |
| | | | SN | 1 | 30 Hz | 5 Hz | 0-15 ms | 0-20 ms | 3 | 2 |
| P1 | Y | 40 Hz | System | 4 | | | | | | |
| | | | S2 | 3 | 40 Hz | 10 Hz | 0-20 ms | 0-30 ms | 1 | 1 |
| | | | SN | 5 | Daily | Daily | 0-50 ms | 0-100 ms | 1 | 1 |
| P2 | Z | 60 Hz | System | 2 | | | | | | |
| | | | S1 | 2 | 60 Hz | 20 Hz | 0-10 ms | 0-20 ms | 2 | 1 |
| | | | S2 | 2 | 40 Hz | 10 Hz | 0-10 ms | 0-30 ms | 2 | 1 |
| P2 | W | 25 Hz | System | 5 | | | | | | |
| | | | S2 | 5 | Monthly | Monthly | 0-100 ms | 0-100 ms | 1 | 1 |
| | | | SN | 3 | 25 Hz | 5 Hz | 0-50 ms | 0-100 ms | 2 | 1 |
| PN | Q | 60 Hz | System | 3 | | | | | | |
| | | | S1 | 3 | 60 Hz | 20 Hz | 0-50 ms | 0-100 ms | 1 | 1 |
| PN | R | 60 Hz | System | 4 | | | | | | |
| | | | S1 | 4 | 60 Hz | 20 Hz | 0-50 ms | 0-100 ms | 1 | 1 |

Fig. 5

SYSTEMATIC ADAPTATION OF DATA DELIVERY

CROSS-REFERENCE TO RELATED APPLICATIONS

This application claims the benefit of U.S. Provisional Application No. 61/683,616, filed Aug. 15, 2012 entitled "Systematic Adaptation of Data Delivery," which is incorporated herein by reference in its entirety.

STATEMENT REGARDING FEDERALLY-SPONSORED RESEARCH

This invention was made with government support under DE-OE0000097 (TCIPG) awarded by the Department of Energy. The government has certain rights in the invention.

BACKGROUND

The communication systems for the electric power grids in North America were developed in response to the 1965 North-Eastern US blackout. Today's Supervisory Control and Data Access systems, which form the core of the communication system for monitoring and controlling the wide-area power grid, are based on the requirements and technology of that time period. However, in recent years, the data collection capabilities of different power grid monitoring systems, such as the Energy Management Systems' computing capacity in control centers have grown enormously.

Advances have been made to improve data exchange and availability of data by improving the communications infrastructure. However, with the continued expansion and variety of applications that are utilizing the data, greater flexibility in data delivery and reliability is needed. Systems today publish data at a fixed data rate and subscribers all receive the data at the published rate. If data packets are not received, they are treated as missed packets. Because of this structure, there is no way to efficiently manage and adapt data delivery to account for changing conditions. If the rate of data delivery is reduced, or packets are missed, many of today's systems and monitoring applications may become unreliable or disrupted due to the missing data.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 5 is a block diagram of a data parameters table for use in managing the delivery of power grid data from publishers to subscribers, in accordance with one implementation.

Figure 1:
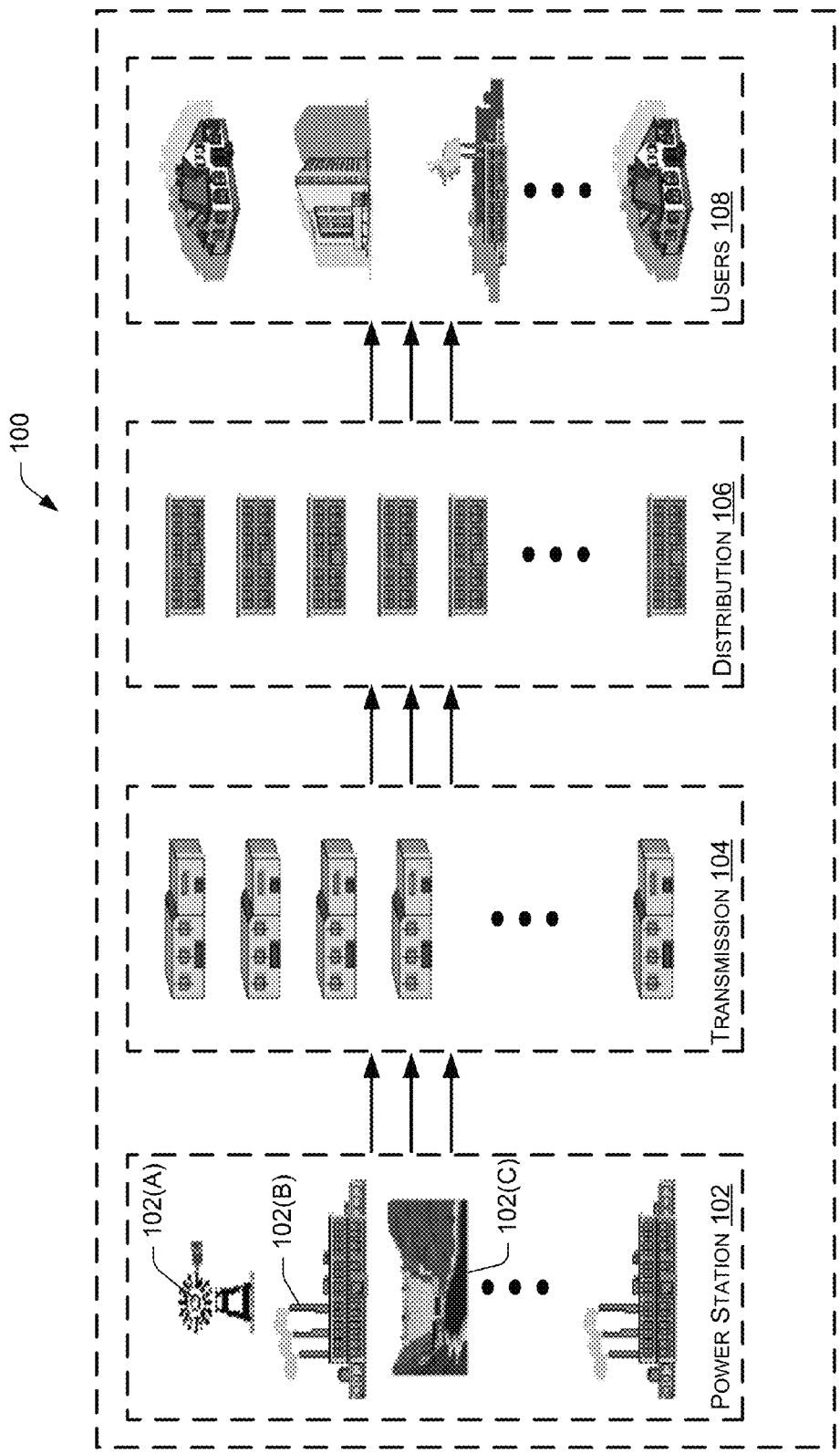
FIG. 1 is a pictorial diagram of a power grid system.

While implementations are described herein by way of example, those skilled in the art will recognize that the implementations are not limited to the examples or drawings described. It should be understood that the drawings and detailed description thereto are not intended to limit implementations to the particular form disclosed, but on the contrary, the intention is to cover all modifications, equivalents, and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION

This disclosure describes, in part, a system management component that utilizes a rate-based system to systematically manage the delivery of data to subscribers to ensure a desired minimum quality of service ("QoS") for each subscription. For example, publishers of power grid data, such as transmission substations, identify to the system management component the rate at which they will publish data. Subscribers, such as control centers, regional security coordinators, neighboring control centers, other substations, etc. will also communicate with the system management component and identify the data to which they wish to subscribe, the desired data rate, desired latency and desired availability (collectively "desired QoS"). The subscribers may also identify a minimum acceptable data rate, minimum acceptable latency and a minimum acceptable availability level (collectively "minimum QoS"). Utilizing this information, the system management component will implement routing that will provide the desired QoS for the subscription under normal conditions and provide at least the minimum QoS under all but the most extreme conditions. In addition, because each subscriber can specify different desired QoS, the system management component can individually manage the QoS provided to each subscriber (or collectively manage subscriptions with the same desired QoS and/or minimum QoS) and, if needed, adjust that QoS provided to account for network changes (e.g., increased system load, data path disruptions, failures) and/or changes to the power grid. The subscribers will still receive the subscribed to data at a QoS at least matching the minimum QoS and will still be able to utilize the data delivered at a reduced QoS without concern or disruption.

In addition to the ability to manage data delivery to different subscribers, the publishers do not have to worry about delivering data to each subscriber or delivering data at different rates. Publishers may simply notify the system management component of the rate at which data will be published and the system management component may control the routing, filtering, availability and delivery of that data to the different subscribers at each subscriber's desired QoS. Prior systems simply published to all subscribers at the same rate, regardless of whether the subscriber desired the data at that rate. Through use of a system management component, the load on the network and subscribers can be reduced by filtering the rate at which data is delivered to each subscriber to correspond with the rate actually desired by the subscriber. This also reduces the load on the subscribers as they no longer have to receive and process undesired data.

While the examples provided herein focus primarily on power grid data systems, it will be appreciated that the described implementations may be used in any rate-based data network and the power grid system is used only as an example. For example, the implementations used herein may equally be used in an oil and gas data network.

FIG. 1 is a pictorial diagram of a power system 100. The power system 100 typically includes one or more power stations 102, transmission 104, distribution 106 and users 108 that create demand for the power. Power stations 102 may include any form of power generation. For example, a power station 102 may be a wind based power station 102(A), such as a wind farm, a fossil-fuel based power station 102(B), a hydroelectric power station 102(C), etc. The power system 100 may include any number and type of power stations 102.

Electric-power generated by the power stations 102 is bulk transmitted at high-voltages via a series of transmission 104 lines and stations from the generating power stations 102 to distribution stations 106. Transmission 104 lines and stations when interconnected with each other create transmission networks, which are often referred to as "power grids." The United States has three major power grids, the Western Interconnection, the Eastern Interconnection and the Electric Reliability Council of Texas (ERCOT) grid, often referred to as the Western Grid, the Eastern Grid and the Texas Grid.

The distribution 106 stations are located near the users 108 that create the demand for the power. The distribution 106 stations receive the bulk transmissions, step down the voltage and distribute the electricity to end users 108, such as residential housing, businesses, commercial buildings, etc.

A few of the major constraints with power systems is that power within the system must run at the same frequency and, with only a few exceptions, electrical energy cannot be stored. As such, power must be generated and supplied in real-time at a rate that matches demand. If the demand for power exceeds supply, generation stations 102 and transmission 104 can shut down, causing brownouts or blackouts for hundreds or more customers.

To help protect against power disruptions and to manage the power system, data about the system itself, current power demand and available power supply are published to numerous monitoring tools and systems that regulate and control the operational state of the power system. Historically, these monitoring tools and systems, referred to herein generally as "subscribers," included visual graphs that were presented to human operators. In such systems, the human portion allowed for missed packets of data and delay/inconsistency in the data being delivered without significant disruption. Also the rate of delivery was slow as only a limited amount of data can be viewed by humans at a given time. However, a growing number of the subscribers that receive published data about the power system are computer applications that work autonomously to adjust and/or monitor the state of the power system. Such systems often require that data be delivered consistently and at a specific QoS (rate, latency and availability), which is often higher than the QoS needed for applications involving human interaction.

Subscribers and publishers can exist on a wide range of devices, ranging from embedded devices of limited computation power to high-power computers running modeling and/or simulation applications within control centers. In addition, subscribers and publishers are roles played by the application or computing device and any application or computing device may be a publisher, subscriber or both.

Figure 2:
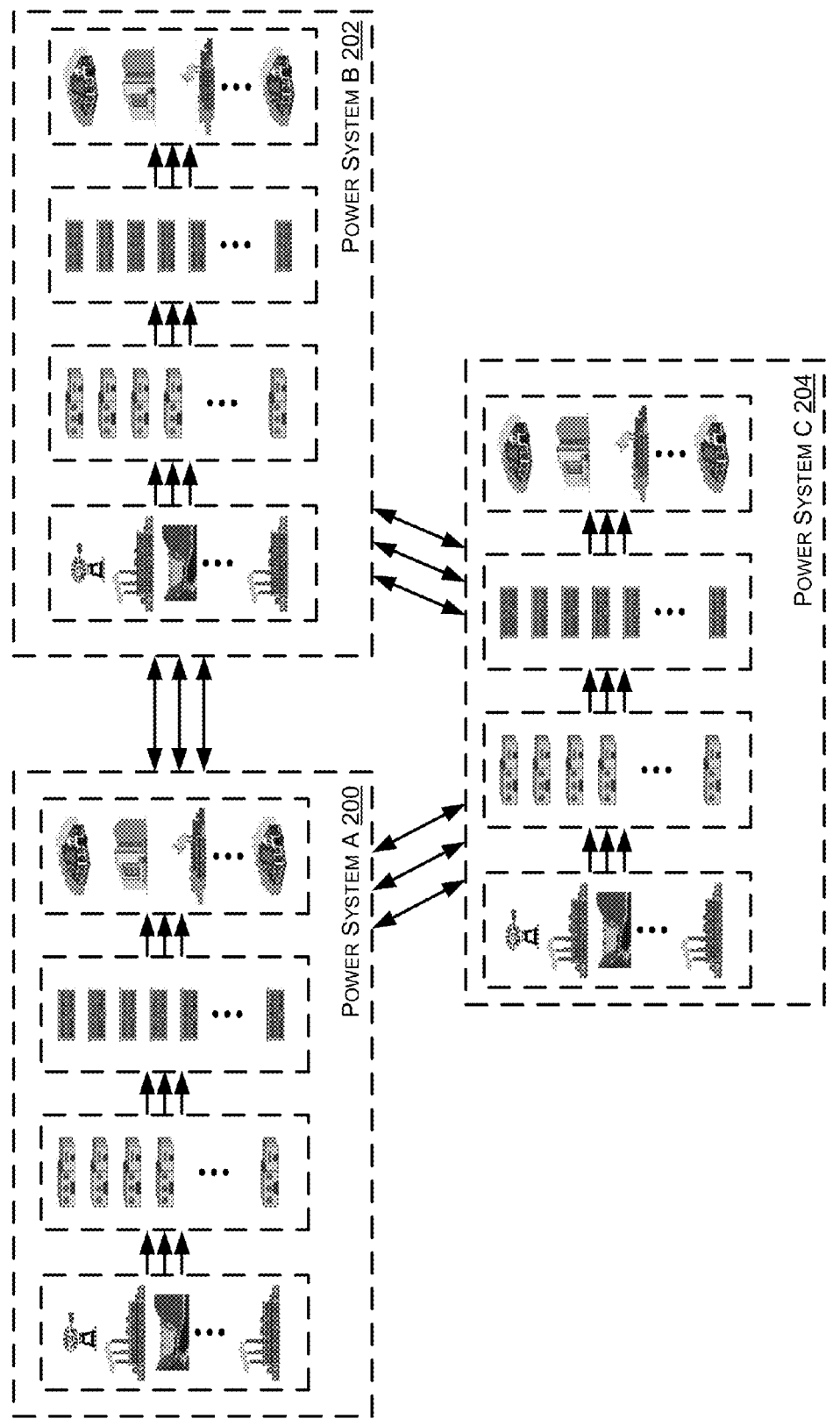
FIG. 2 is a pictorial diagram of multiple power grid systems.

In addition to the increasing number of subscribers that manage and monitor the power system 100 to protect against disruptions, many power systems are now interconnected and/or sharing data so that they can leverage other systems to protect against failure in a single power system, as illustrated in FIG. 2. For example, FIG. 2 illustrates three power systems interconnected with one another to help further balance power across systems and prevent disruptions to customers. For example, each of Power System A 200 (which may represent the Western Grid in North America), Power System B 202 (which may represent the Eastern Grid in North America) and Power System C 204 (which may represent the Texas Grid in North America) are connected and share power related data and information. This information, while beneficial in increasing knowledge between the power systems, adds yet more complexity to the need for managing in real-time the data sent from publishers of the various power systems to subscribers.

Figure 3:
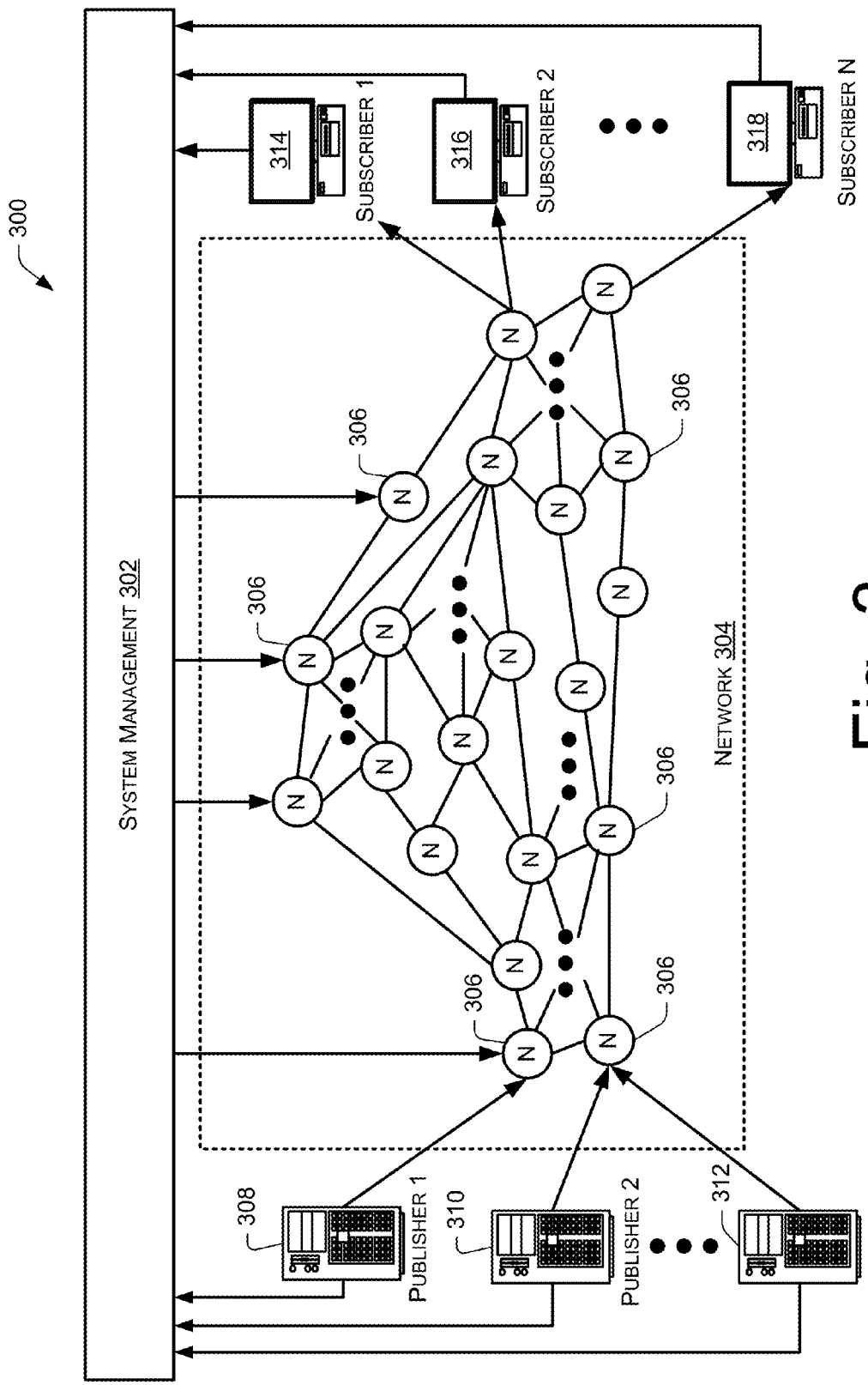
FIG. 3 is a pictorial diagram of a data delivery system for managing the delivery of power grid data from publishers to subscribers, in accordance with one implementation.

FIG. 3 is a pictorial diagram of a data delivery system 300 for managing the delivery of power grid data from publishers to subscribers, in accordance with one implementation. In this example, the system management component 302 manages network resources to achieve low-latency, reliable delivery of data produced anywhere on the network and sent to multiple other points. The system management component 302 allocates resources and adapts the network 304 in response to changing power system configurations and/or communication network failures. In addition, the system management component 302 communicates with nodes 306 within the network 304 to provide forwarding instructions for data published by the various publishers 308, 310, 312. The nodes 306 may be status routers, forwarding engines, message relays and/or any combination thereof. The nodes 306 forward the data published by the publishers 308, 310, 312 through the network 304 to appropriate subscribers 314, 316, 318.

With the system management component 302 structure illustrated in FIG. 3, publishers 308, 310, 312 may subscribe to the system management component 302 and publish data that is distributed to subscribers 314, 316, 318 without the publisher 308, 310, 312 having to track, communicate or even know of the existence of the subscribers. This simplifies application programs and gives the system 300 the flexibility to add subscribers and even change the characteristics of existing subscriptions without disrupting the publishers 308, 310, 312. In some implementations, a publisher 308, 310, 312 may simply notify the system management component 302 of the availability of data and the rate at which the data will be published.

Subscribers 314, 316, 318 may request that the system management component 302 establish delivery data paths through the network 304 to accomplish delivery of the data to the subscriber at a desired quality of service (QoS), including rate, latency and availability. In some implementations, a minimum QoS may also be specified, including a minimum acceptable data rate, minimum acceptable latency and minimum acceptable availability. A priority and/or security requirement for the subscription may also be provided. The system management component 302 confirms that the desired QoS can be satisfied based on the available resources and the publish rate of the data provided by the publisher. Once established, the desired QoS and minimum QoS agreed to between the system management component 302 and the subscriber, the system management component 302 defines the necessary data path(s) needed to ensure the minimum QoS for availability and provides forwarding rules to the nodes 306 so the data is routed along one of those defined data paths and delivered to the subscriber at the desired rate with the desired latency.

Because subscribers can request lower update rates than the rate at which the data is published by the publisher, some items of data may not need to be forwarded. In such an instance, the system management component 302 may provide rate filtering rules to the nodes to filter out undesired data as part of the forwarding scheme, thereby reducing unnecessary load on the network 304 and the subscriber.

Figure 4:
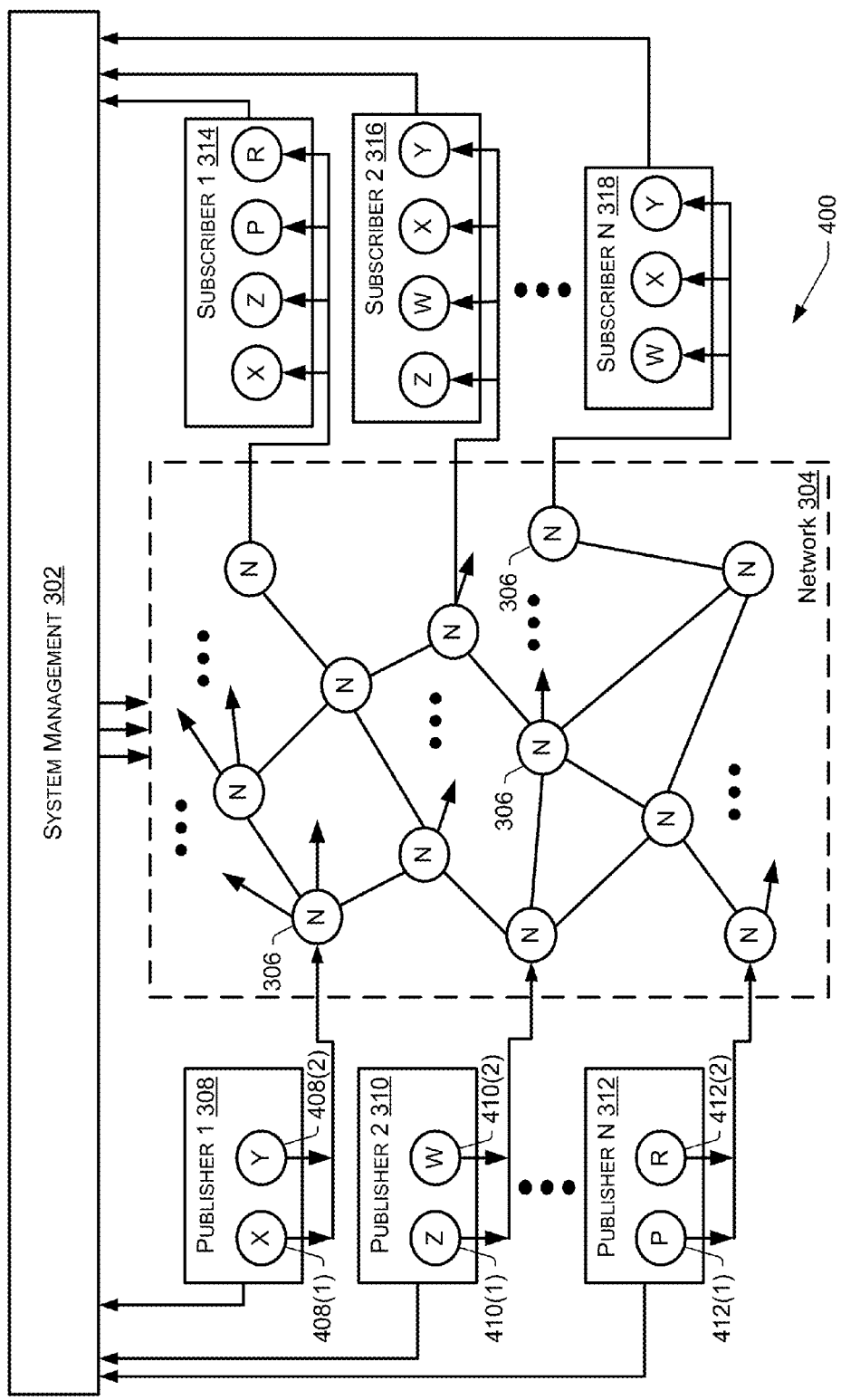
FIG. 4 is a pictorial diagram of power grid data delivery between publishers and subscribers, in accordance with one implementation.

FIG. 4 provides a more detailed view of data delivery system 400 in which publishers, publisher 1 308, publisher 2 310 and publisher 3 312 are publishing data to subscribers, subscriber 1 314, subscriber 2 316 and subscriber N 318. Specifically, in this example, publisher 1 308 is publishing data X 408(1) and data Y 408(2), publisher 2 310 is publishing data Z 410(1) and data W 410(2) and publisher N 312 is publishing data P 412(1) and data R 412(2). As will be appreciated, more or fewer publishers may be utilized with the implementations described herein. Likewise, the publishers may publish any number and types of data.

Returning to FIG. 4, subscriber 1 314 has subscribed to receive data X 408(1), data Z 410(1), data P 412(1) and data R 412(2). Subscriber 2 316 has subscribed to receive data Z 410(1), data W 410(2), data X 408(1) and data Y 408(2). Subscriber N 318 has subscribed to receive data W 410(1), data X 408(1) and data Y 408(2). Similar to the publishers, any number and combination of subscribers may be used with the implementations described herein and each subscriber may subscribe to any number of data publications from any number of different publishers.

To ensure delivery of the published data according to the various subscriptions, each publisher 308, 310, 312 is connected to a node 306 via a point-to-point or broker based communication connection. The point-to-point connection may be an actual point-to-point link, a virtual point-to-point connection established over an IP network, an ATM network, a SONET ring, etc., or a broker based communication connection. In some implementations, the network 304 may be a combination of both peer-to-peer and broker based connections. Regardless of structure, the connection carries data items from the publisher into the network 304.

Similarly, each subscriber 314, 316, 318 is connected to a node 306 via a point-to-point or broker based connection that carries data items for each of the subscriber's subscriptions from the network 306 to the subscriber 314, 316, 318. Between the publishers 308, 310, 312 and each subscribing subscriber 314, 316, 318, there is at least one delivery data path through other nodes 306 within the network 304. Each node 306 has potentially many incoming and outgoing connections that connect it to publishers, subscribers and/or other nodes 306 within the network. Each node 306 forwards incoming data on an outgoing connection according to forwarding rules provided by the system management component 302. The forwarding rules are established by the system management component 302 when the subscription is established and provided to the nodes 306 within the network 302 along with any rate filtering rules.

As can be seen from the example illustrated in FIG. 4, different subscribers may subscribe to data items from different publishers. Likewise, those subscribers may request that the data be delivered at different rates, latency, have different levels of availability, and/or the subscriptions may have different levels of priority for each subscriber. For example, subscriber 1 314, subscriber 2 316 and subscriber N 318 all subscribe to data item X 408(1) published by publisher 1 308. While each is receiving the data, they may be receiving it at different rates. By utilizing the system management component 302, publisher 1 308 does not need to know the identity of each subscriber or the desired QoS (or minimum QoS) at which they desire to receive data X 408(1). The publisher simply publishes the data at a publisher specified rate and the system management component 302 communicates with the nodes 306 in the network 304 by providing routing rules and rate filtering rules to ensure that the data is routed to each subscriber at the desired subscription rate with the desired latency and the appropriate number of data paths are available (availability). Generally, the system management component and the implementations described herein allow for a publisher to publish data at a single rate and that data is provided to each subscriber at the subscriber's desired QoS, which may be different for each subscriber. One constraint being that the subscriber's desired rate cannot exceed the published rate.

In one implementation, in addition to specifying a desired QoS, each subscriber may also specify a minimum acceptable QoS for each subscription and a priority of importance among subscriptions of that subscriber. For example, referring to FIG. 5, Subscriber 1 314 has subscribed to data X 408(1) with a desired data rate 502 of 60 Hz, a minimum data rate 504 of 20 Hz, a desired latency 505 of 0-5 ms, a minimum latency 507 of 0-10 ms, three desired data paths 506, two as a minimum data paths 509 availability and a priority 508 of 1. This information is all maintained by the system management component 302 and utilized to establish data paths through the network 304 to ensure availability, in this instance three data paths, for delivery of the data X 408(1) from publisher 1 308 to subscriber 1 314 within the desired latency 505 and any rate filtering rules to ensure delivery at the desired rate 502. In comparison to data X 408(1), subscriber 1 314 has also subscribed to data P 412(1) at a desired rate 502 of 30 Hz, a minimum data rate 504 of 20 Hz, a desired latency 505 of 0-50 ms, a minimum latency 507 of 0-100 ms, one desired data path 506, one as a minimum data paths 509 and a priority 508 of 3. As illustrated, publisher N 312 is publishing the data P 412(1) at a rate of 60 Hz. Utilizing the knowledge of the desired data rate 502 of the subscriber 314, the system management component 302 can provide filtering rules to the nodes 306 within the network 304 to filter undesired data, thereby reducing overall load on the network and the subscriber.

Figure 6:
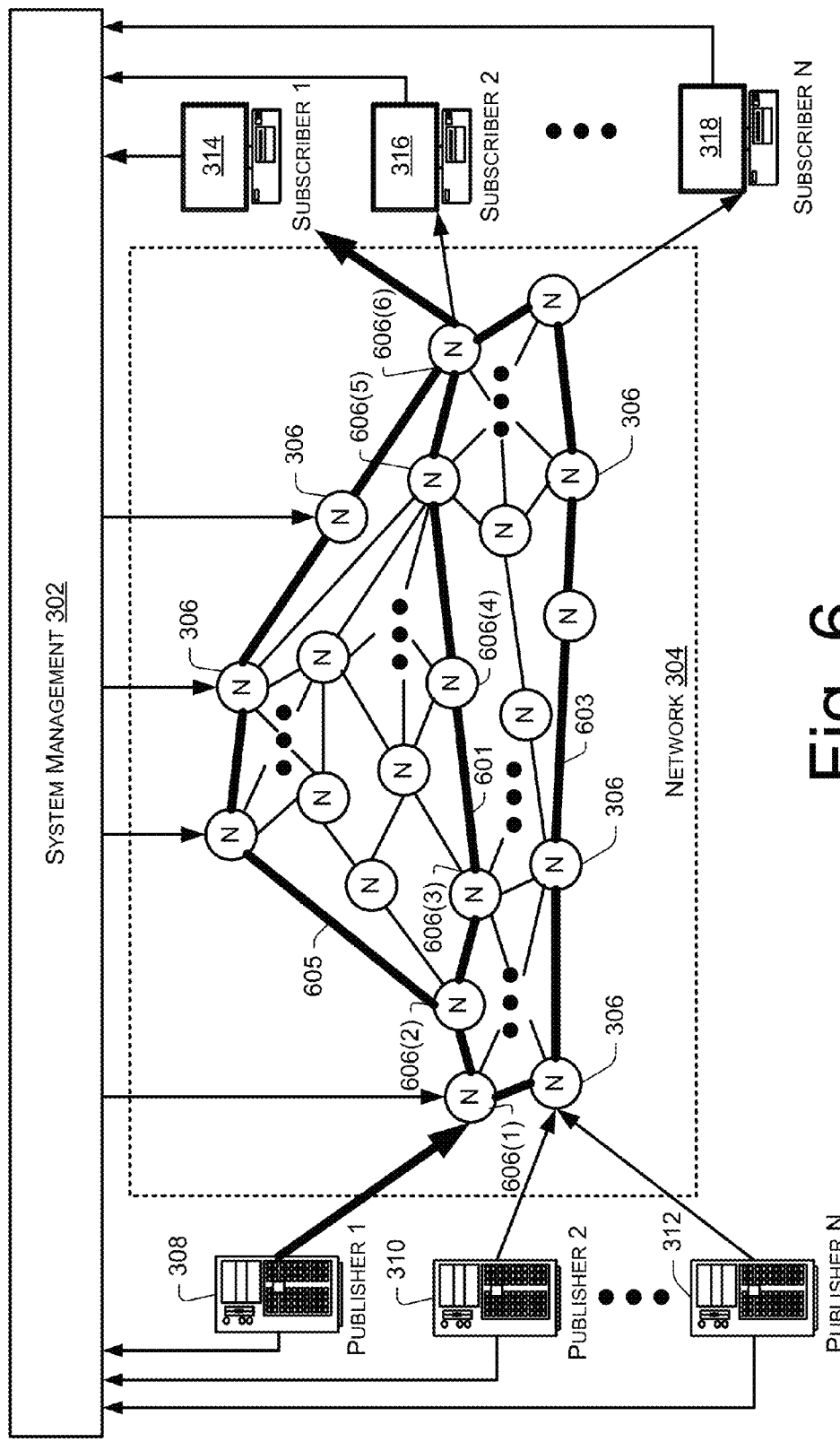
FIG. 6 is a pictorial diagram of data path plans for delivering power grid data from a publisher to a subscriber, in accordance with one implementation.

The information provided by each subscriber may also be used to identify the appropriate data path or data paths between the publisher and subscriber. For example, FIG. 6 illustrates the three network data paths established for the subscription of subscriber 1 314 for data X 408(1) published by publisher 1 308. The data rate, latency, priority and other information may be used to define alternative data paths through the network 304 that will ensure delivery of the data at the desired QoS. Likewise, different data paths, such as data path 1 601, data path 2 603 and data path 3 605 may be established that can route the data through different areas or geographic regions of the network 304 to provide the desired availability in the event of outages or network interruptions. For example, data path 1 601 may be the default data path through which data X 408(1) is delivered to subscriber 1 314 from publisher 1 308 with data path 2 603 being the first alternate data path and data path 3 605 being the second alternate data path. Each data path is designed to meet at least the minimum acceptable date rate and minimum acceptable latency specified by the subscriber 314 and accepted by the system management component 302. However, each data path transitions through a different segment of the network so that if part of the network is disrupted or overloaded, the data can be shifted to one of the other defined alternate data paths.

Maintaining multiple data paths for higher priority subscriptions allows the system management component 302 to modify the routing of data among defined data paths to balance load across the network and/or dynamically reroute data in the event one or more of the data paths becomes disrupted. For example, if the data load on one or more of the nodes 306 used for data path 1 601 increases such that excessive processing delay may disrupt the rate of delivery, rather than reducing the delivery rate, the system management component 302 may proactively reroute the data over data path 2 603 before the load on the node 306 becomes too high. In addition, if the link between nodes 306 in a data path is interrupted, data can be routed across another defined data path without disrupting delivery of the data to the subscriber.

In addition to managing network load by having the ability to route data across multiple defined data paths for a subscription, the system management component 302 may also manage data load across the network 304 based on the priority of the data to the subscribers or the network and the minimum acceptable QoS parameters (rate, latency, availability) for which the subscriber can receive the data. For example, if the environment changes such that data loads are excessive on the network, the system management component 302 may monitor the load and if it cannot be sufficiently balanced by adjusting data paths, it may reduce the rate of delivery for certain subscriptions (e.g., lower priority subscriptions) from the desired delivery rate down to, if necessary, the minimum accepted delivery rate. This may be done at many levels within the system. Likewise, the latency of a lower priority subscription may be increased to, if needed, the minimum acceptable latency (longest latency time) for the subscription.

For example, data rates may be reduced based on the priority assigned by individual subscribers, based on the highest priority assigned to a data publication by any subscriber, based on a priority of the data as specified by the system management component 302, based on the priority of the subscriber, based on a mode applied to various priorities, etc. Likewise, the priorities may change based on the current structure and condition of the network and/or the power grid. In some implementations, the priority may be a random value assigned directly by the subscribers. As will be appreciated, priority as used herein may be determined using one or more of a variety of techniques.

In each instance, the rate of data delivery to one or more subscribers may be reduced so that the network is not overloaded and each subscriber is receiving at least the minimum acceptable data rate for each subscription. In some implementations, the lowest priority subscription may have its data rate lowered to the minimum acceptable data rate before other data rates are reduced. If there are multiple subscriptions with low priorities, their data rates may be reduced at the same rate until each reaches the minimum acceptable data rate associated with each subscription. In still other instances, if there are multiple low priority subscriptions, a utility function may be utilized to determine which one or more of the low priority subscriptions should be modified. For example, modification of each low priority subscription may be considered, and a utility, or loss of utility, resulting from the modification may be determined. The low priority subscription that realizes the lowest loss of utility from a modification may be selected for QoS reduction. In still another example, if there are multiple low priority subscriptions, the subscription(s) with the largest difference between the desired data rate and the minimum acceptable data rate may be reduced first. Regardless of the implementation used, because the system management component 302 is a rate-based system, data can be adjusted systematically and each of the subscribers may continue utilizing the data without disruption resulting from missed data packets.

Figure 7:
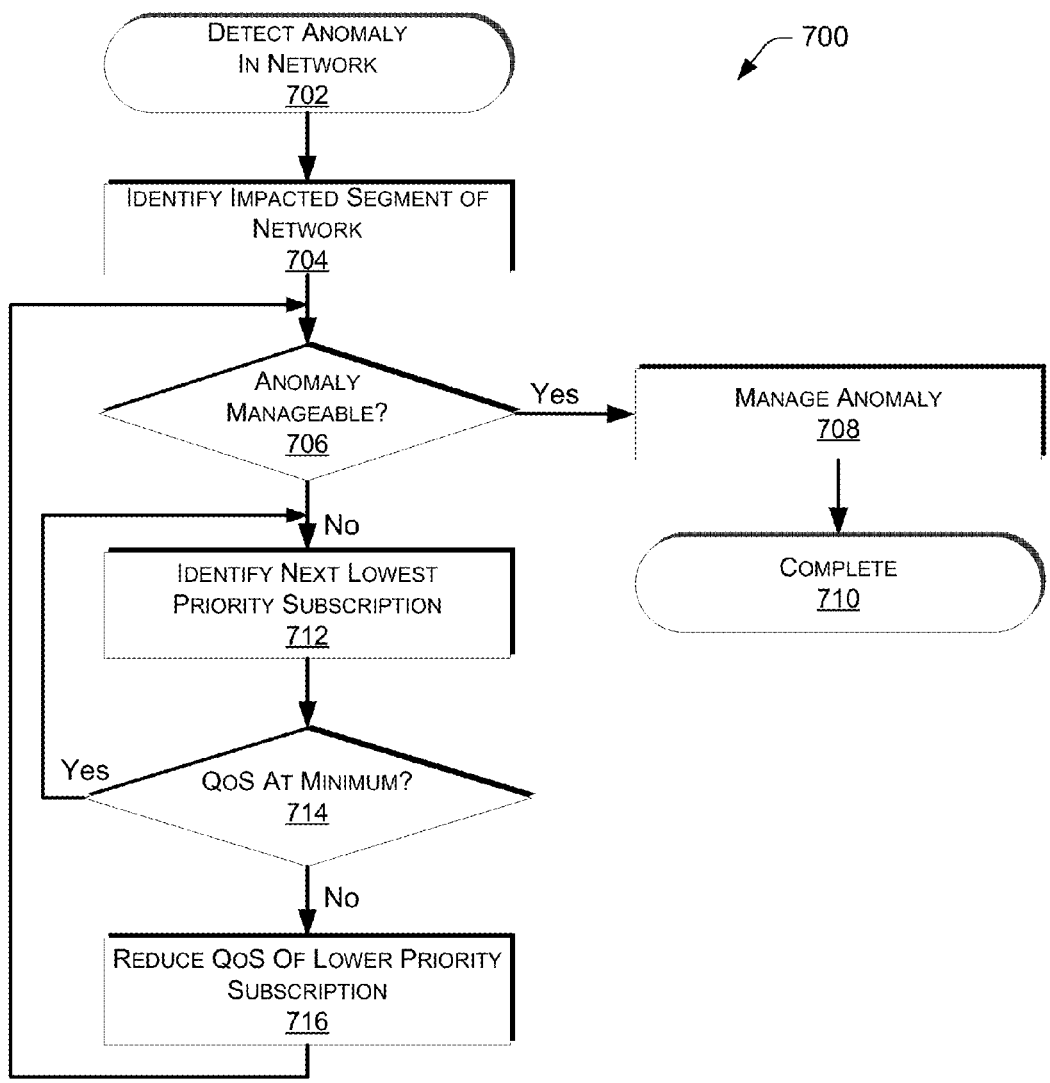
FIGS. 7-10 are flow diagrams of example processes for systematically adapting power grid data delivery, in accordance with various implementations.
Figure 8:
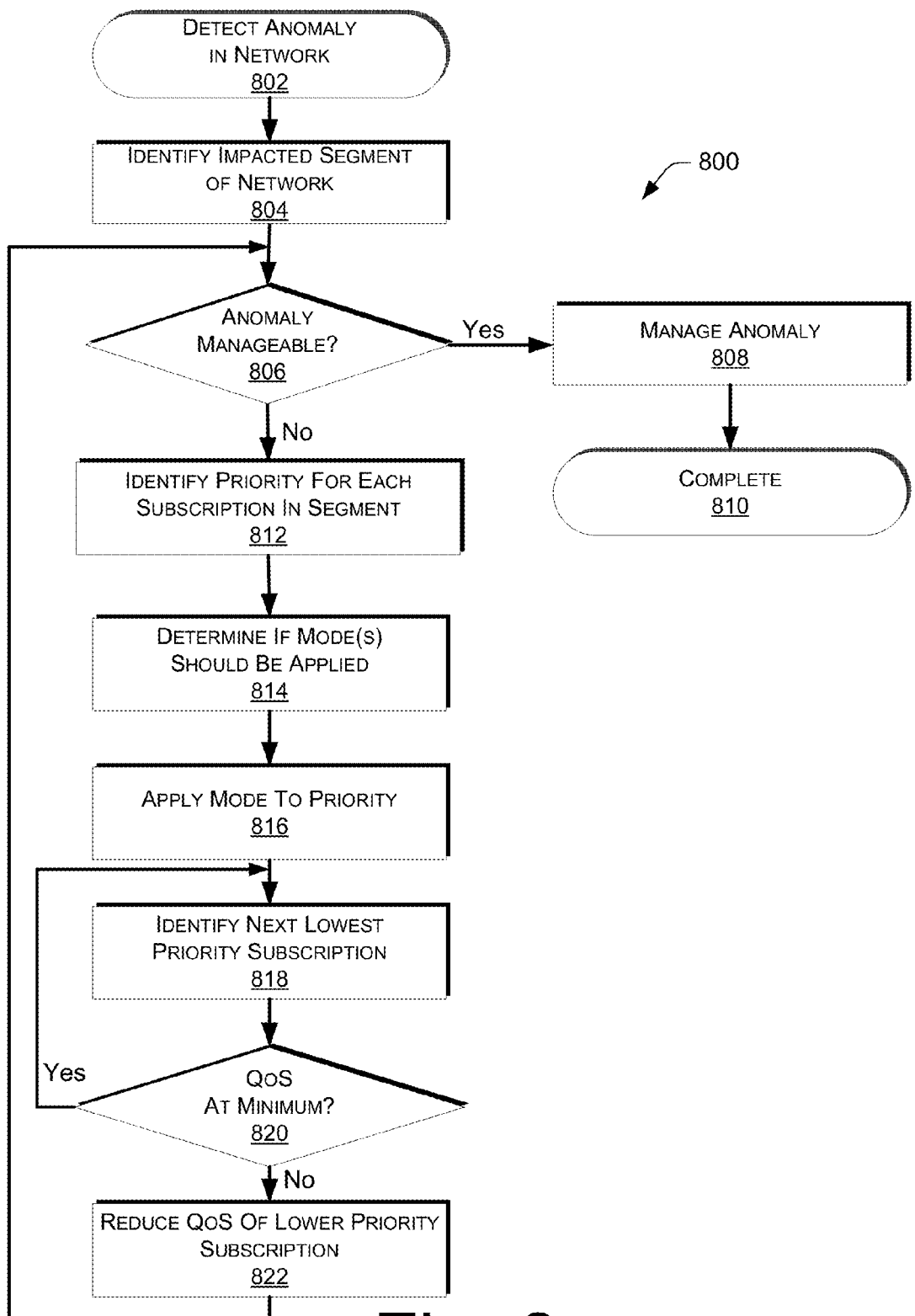
Figure 9:
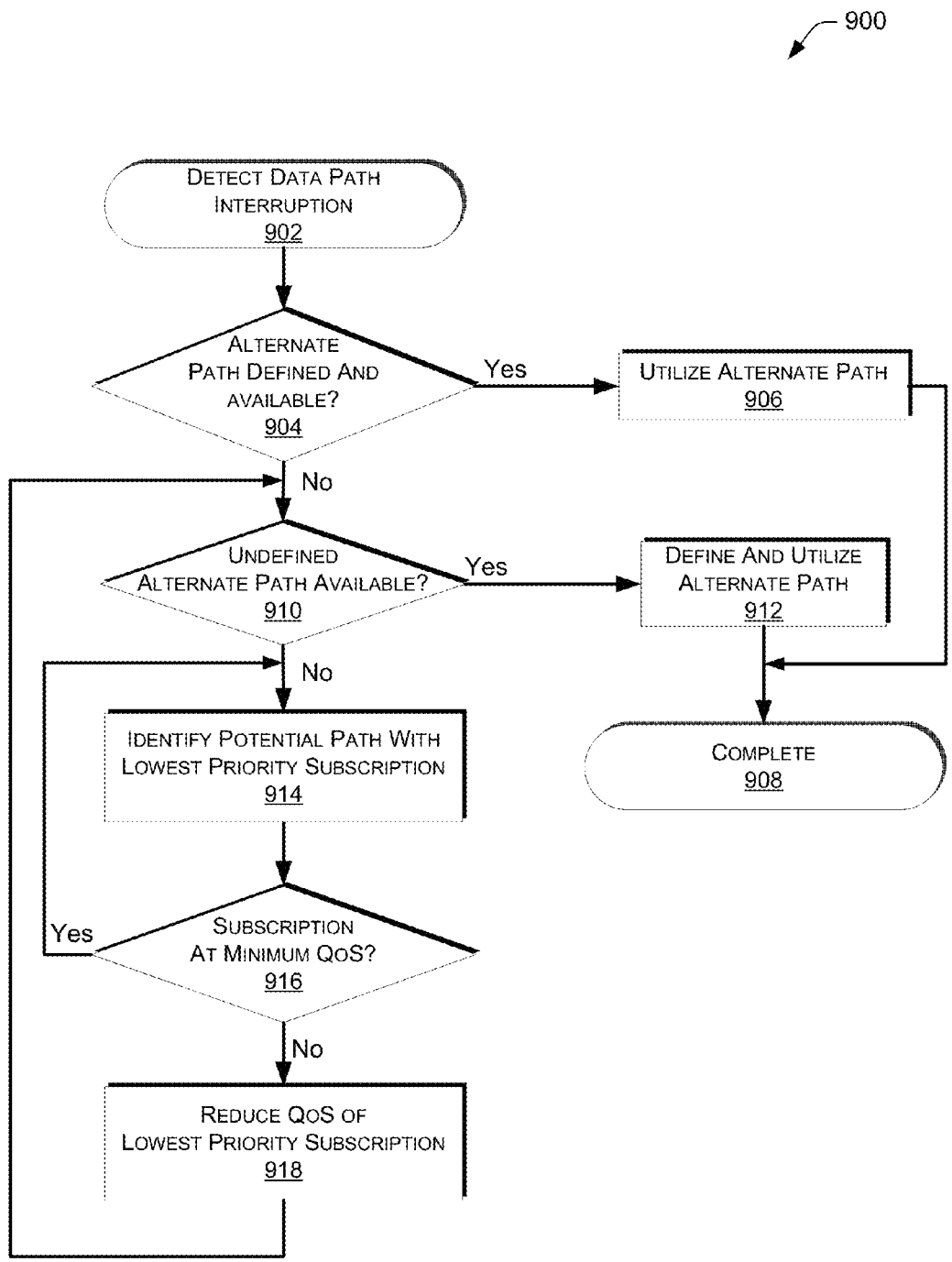
Figure 10:
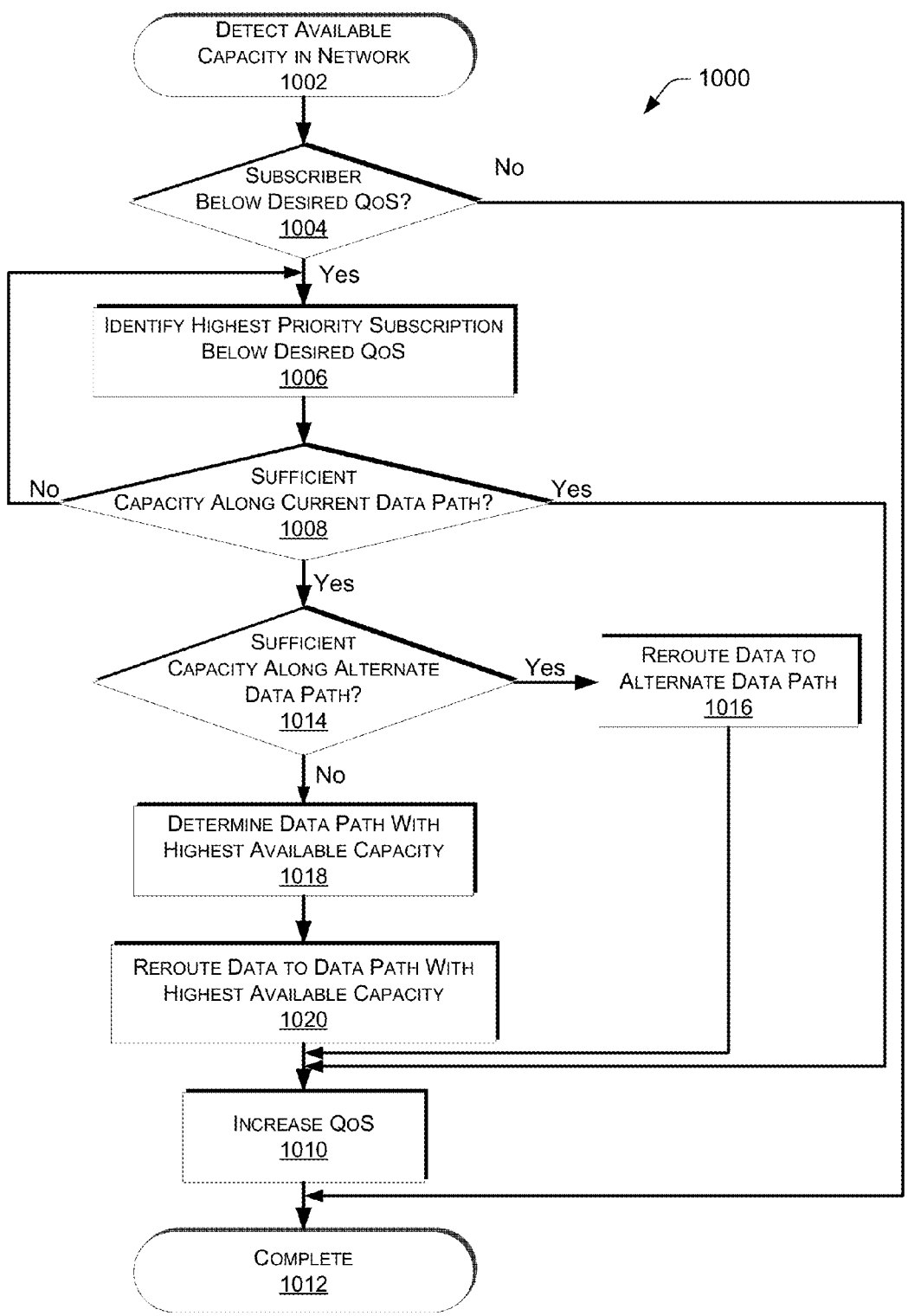

FIG. 7 is a flow diagram of an example process 700 for systematically adapting data delivery, in accordance with one implementation. The example process 700 of FIG. 7, as well as each of the other example processes described below with respect to FIGS. 8-10, is illustrated as a collection of blocks in a logical flow graph. Some of the blocks represent operations that can be implemented in hardware, software, or a combination thereof. In the context of software, the blocks represent computer-executable instructions stored on one or more computer-readable media that, when executed by one or more processors, perform the recited operations. Generally, computer-executable instructions include routines, programs, objects, components, data structures, and the like that perform particular functions or implement particular abstract data types.

The computer-readable media may include non-transitory computer-readable storage media, which may include hard drives, floppy diskettes, optical disks, CD-ROMs, DVDs, read-only memories (ROMs), random access memories (RAMs), EPROMs, EEPROMs, flash memory, magnetic or optical cards, solid-state memory devices, or other types of storage media suitable for storing electronic instructions. In addition, in some implementations the computer-readable media may include a transitory computer-readable signal (in compressed or uncompressed form). Examples of computer-readable signals, whether modulated using a carrier or not, include, but are not limited to, signals that a computer system hosting or running a computer program can be configured to access, including signals downloaded or uploaded through the Internet or other networks. Finally, the order in which the operations are described is not intended to be construed as a limitation and any number of the described operations can be combined in any order and/or in parallel to implement the process. Likewise, additional or fewer operations than those described may be utilized with the various implementations described herein.

The example process 700 begins upon the detection of an anomaly within the network, as in 702. An anomaly may result from increased load, network failure, disruption, attacks on the network (a.k.a. cyber-attacks), etc. For example, a portion of the network may become disabled or otherwise unavailable (an anomaly). As a result of the anomaly, the data items may need to be rerouted through other segments of the network, the rate of data delivery reduced, and/or the latency increased.

Upon detecting an anomaly within the network, the impacted segment of the network is identified, as in 704. In many large networks, anomalies may only affect a portion of the network or only one or more nodes within the network. For example, an anomaly may be limited to a single node or group of nodes within the network. Based on the identification of the impacted segment of the network, a determination is made as to whether the anomaly is manageable without altering a rate of data delivery or latency, as in 706. For example, if the anomaly is only impacting a small segment of the network and each subscription receiving data through that segment of the network can be rerouted to alternative data paths without causing other anomalies or disruptions within the network, it may be determined that the anomaly is manageable without reducing the rate of data delivery to subscribers and/or latency of delivery. Rerouting of data across alternative data paths is described in more detail below with respect to FIG. 9.

If it is determined that the anomaly is manageable without reducing the rate of delivery of data to one or more subscribers and/or modifying latency, the example process 700 manages the anomaly, as in 708, and completes, as in 710. As noted above, managing a network anomaly without reducing the data rate and/or increasing the latency may be done by, for example, rerouting the data paths to unaffected segments of the network. In instances where the anomaly is a cyber-attack, the anomaly may be managed by eliminating the data source and/or data causing the cyber-attack. For example, if data traffic arrives on the network claiming to be from a publisher from which data is already being received, it may be determined which set of data is accurate and the false data filtered out of the network. Many techniques for managing cyber-attacks are known in the art and will not be discussed in further detail herein.

However, if it is determined at decision block 706 that the anomaly is not manageable without reducing the rate of delivery and/or latency of one or more data publications, the example process 700 identifies a low priority subscription, as in 712. Identifying a low priority subscription may be done systematically. For example, it may first be determined if there is a low priority subscription with a data path through the impacted segment. If there are no low priority subscriptions using the impacted portion of the network, a low priority subscription using a potentially alternative data path through the network may be identified and the QoS reduced so that higher priority subscriptions can be rerouted and delivered at the desired QoS.

The priority from multiple subscribers may be considered when identifying a low priority subscription. For example, if multiple subscribers (i.e., two or more subscribers) are subscribing to the data and the data is routed for those subscribers as a single data transmission along the segment of the network for which QoS reduction may occur, the example process 700 may consider only the highest priority for those subscriptions.

Referring back to FIG. 6, if the impacted segment of the network is at node 606(2) and two subscribers, subscriber 1 314 and subscriber N 318, both subscribe to data from publisher 1 308 that is routed as a single data transmission through the network via nodes 606(1), 606(2), 606(3), 606 (4), 606(5) before separating at node 606(6) for delivery to the subscribers, the example process 700 may consider only the highest priority for those two subscriptions. In this example, if the data rate for that published data is reduced at node 606(2), it will be reduced for both subscribers 314, 318 unless it is separated into different transmission data paths for each subscriber and transmitted as independent data at different rates across the network. As such, the remaining portion of the network to be traveled by the data may be considered when deciding whether to consider only the highest priority for published data for which there are multiple subscribers. In addition to priority, as discussed below, the minimum acceptable data rate for each subscriber may also be considered.

Upon identifying a lower priority subscription, a determination is made as to whether the QoS for that subscription is already at a minimum, as in 714. For example, it may be determined if the data rate is already at a minimum acceptable data rate and/or weather the latency is already at a minimum acceptable latency. As discussed above, subscribers may identify a desired data rate for a subscription, a minimum acceptable data rate for the subscription, a desired latency, a minimum acceptable latency and a priority for each subscription. Determining if the data rate and/or latency are at a minimum may consider the minimum acceptable data rate and minimum acceptable latency from multiple subscribers.

Returning to the above example, if subscriber 1 314 and subscriber N 318 both subscribe to the same published data but subscriber 1 314 has a minimum acceptable data rate of 50 Hz and subscriber N 318 has a minimum acceptable data rate of 20 Hz, the example process 700 may only consider the higher minimum acceptable data rate of 50 Hz. Likewise, if subscriber 1 314 has a minimum acceptable latency of 0-15 ms and subscriber N 318 has a minimum acceptable data rate of 0-20 ms, the example process 700 may only consider the shorter minimum acceptable data rate of 0-15 ms. In this instance, only the higher minimum acceptable data rate and/or shorter minimum acceptable latency may be considered because the data for both subscribers is transmitted as a single unit through the affected portion of the network. If the published data is kept as a single data transmission and reduced to 20 Hz or the latency extended to 20 ms, subscriber 1 314 would not receive the data at the specified minimum QoS.

As an alternative, the published data may be separated into two data paths so that it can be transmitted at different rates and/or latencies to the different subscribers. In this example, it would be unlikely that the data published from publisher 1 would be separated into multiple data paths because it would result in the same data traversing a large percentage of the network multiple times. However, if the segment of the network in which the anomaly occurs is closer to the delivery side of the network, such as node 606(6), the example process 700 may determine that the data paths for the published data may be separated for delivery to subscriber 1 314 and subscriber N 318 without undue load on the network. For example, the data paths may be separated at node 606(5) and the data rate for subscriber 1 314 reduced to the minimum acceptable rate and routed through the affected node 606(6) while data for subscriber N 318 is separated at node 606(5) and rerouted through other nodes within the network at the desired data rate.

Returning to the example process 700, if it is determined that the low priority subscription is at a minimum data rate and/or minimum latency for the subscriber, the example process 700 returns to block 712 and identifies the next lowest priority subscription. However, if it is determined that the data rate and/or latency for the subscriber are not at a minimum, the data rate and/or latency may be reduced for the low priority subscription, as in 716. As discussed above, the rate of data delivery for different subscriptions may be reduced by one or more nodes within the data path filtering out data packets. Additionally, if there are multiple subscribers receiving the same data from the same path, the data rate may only be reduced to the highest minimum acceptable rate for those subscribers. In still other instances, if there are multiple low priority subscriptions, the data rate for each may be reduced until the anomaly is resolved or it can be managed without further reduction of data rates. For example, if there are three low priority subscriptions identified, rather than reducing one subscription from the desired data rate to the minimum acceptable data rate, the data rate for each of the three subscriptions may be reduced a smaller amount.

In a similar manner, the latency for different subscriptions may be modified by, for example, one or more nodes within the data path processing and forwarding higher priority data before lower priority data. Additionally, if there are multiple subscribers receiving the same data from the same path, the latency may only be modified to the shortest minimum acceptable rate for those subscribers. In still other instances, if there are multiple low priority subscriptions, the latency for each may be reduced until the anomaly is resolved or it can be managed without further modification of latency. For example, if there are three low priority subscriptions identified, rather than modifying the latency of one subscription from the desired latency to the minimum acceptable latency, the latency for each of the three subscriptions may be modified a smaller amount.

Upon modifying the QoS (data rate and/or latency) of the lower priority subscription, the example process 700 may confirm whether the anomaly affecting the impacted segment of the network is manageable without further QoS reductions for other subscriptions or if additional changes need to be made. Specifically, the example process 700 may return to decision block 706 and continue until either the anomaly is resolved or becomes manageable without further QoS reductions.

FIG. 8 is a flow diagram of an example process 800 for systematically adapting data rate delivery, in accordance with another implementation. The example process 800 begins upon the detection of an anomaly within the network, as in 802. An anomaly may result from increased load, network failure, disruption, attacks on the network (a.k.a. cyber-attacks), etc. For example, a portion of the network may become disabled or otherwise unavailable (an anomaly). As a result of the anomaly, the data items may need to be rerouted through other segments of the network, the latency modified and/or the rate of data delivery reduced.

Upon detecting an anomaly within the network, the impacted segment of the network is identified, as in 804. In many large networks, anomalies may only affect a portion of the network or only one or more nodes within the network. For example, an anomaly may be limited to a single node or group of nodes within the network. Based on the identification of impacted segment of the network, a determination is made as to whether the anomaly is manageable without altering a rate of data delivery or latency of the data, as in 806. For example, if the anomaly is only impacting a small segment of the network and each subscription receiving data through that segment of the network can be rerouted to alternative data paths without causing other anomalies or disruptions within the network, it may be determined that the anomaly is manageable without reducing the rate of delivery of the data to subscribers and/or the latency of delivery. Rerouting of data across alternative data paths is described in more detail below with respect to FIG. 9.

If it is determined that the anomaly is manageable without reducing the rate of data delivery to one or more subscribers and/or modifying the latency, the example process 800 manages the anomaly, as in 808, and completes, as in 810. As noted above, managing a network anomaly without reducing the rate of delivered data and/or increasing the latency may be done by, for example, rerouting the data paths to unaffected segments of the network. In instances where the anomaly is a cyber-attack, the anomaly may be managed by eliminating the data source and/or data causing the cyber-attack. For example, if data traffic arrives on the network claiming to be from a publisher from which data is already being received, it may be determined which set of data is accurate and the false data filtered out of the network. Many techniques for managing cyber-attacks are known in the art and will not be discussed in further detail herein.

However, if it is determined at decision block 806 that the anomaly is not manageable without reducing the rate of delivery and/or latency of one or more data publications, the example process 800 identifies the priority established by the different subscribers for the data routed through the affected segment of the network, as in 812. As illustrated above, the priority for each subscription may be provided by the subscribers when subscribing to the publication and maintained by the system management component.

Upon identifying the priority for each subscription, it may be determined if one or more modes should be applied to one, some, or all of the priorities, as in 814. A mode may be a system wide consideration applied by the system management component to account for the overall health of the system the current environment and/or the power grid.

While subscribers may all view their particular data items as high priority, due to certain events within the system, the one or more modes may be applied to modify those priorities. For example, again referring to FIG. 6, subscriber 1 314 may assign a high priority to data received from publisher 1 308 and subscriber 2 316 may assign a low priority to data received from publisher N 312. However, specific network and/or power grid conditions at the time of the network anomaly may result in the system management component applying a mode that elevates the priority of the data published by publisher N 312 for delivery to subscriber N 318 to be above that of the data published by publisher 1 308 and received by subscriber 1 314.

Modes may be established automatically based on network and/or power grid conditions, set manually by operators, publishers and/or subscribers, and/or a combination thereof. Once it is determined if a mode should be applied to one or more of the priorities, they are applied to the priorities, as in 816.

After applying the mode(s), the example process 800 identifies the lowest priority subscription, as in 818. Identifying the lowest priority subscription may be done systematically. For example, it may first be determined if there is a low priority subscription with a data path through the impacted segment. If there are no low priority subscriptions using the impacted segment of the network, a low priority subscription using a potentially alternative data path through the network may be identified and the QoS reduced so that higher priority subscriptions can be rerouted and delivered at the desired QoS.

The priority of multiple subscribers may be considered when identifying a lower priority subscription. For example, if multiple subscribers (i.e., two or more subscribers) are subscribing to the data and the data is routed for those subscribers as a single data transmission along the segment of the network for which QoS reduction may occur, the example process 800 may consider only the highest priority for those subscriptions, considering the added mode(s).

Referring back to FIG. 6, if the impacted segment of the network is at node 606(2) and two subscribers, subscriber 1 314 and subscriber N 318 both subscribe to data from publisher 1 308 that is routed as a single data transmission through the network via nodes 606(1), 606(2), 606(3), 606(4), 606(5) before separating at node 606(6) for delivery to the subscribers, the example process 800 may consider only the highest priority for those two subscriptions after the modes(s) are applied. In this example, if the data rate for that published data is reduced at node 606(2), it will be reduced for both subscribers 314, 318 unless it is separated into different transmission data paths for each subscriber and transmitted as independent data at different rates across the network. As such, the remaining portion of the network to be traveled by the data may be considered when deciding whether to consider only the highest priority for published data for which there are multiple subscribers. In addition to priority, as discussed below, the minimum acceptable data rate for each subscriber may also be considered.

Upon identifying a low priority subscription, a determination is made as to whether the QoS for that subscription is already at a minimum, as in 820. For example, it may be determined if the data rate is already at a minimum acceptable data rate and/or weather the latency is already at a minimum acceptable latency. As discussed above, subscribers may identify a desired data rate for a subscription, a minimum acceptable data rate for the subscription a desired latency, a minimum acceptable latency and a priority for each subscription. Determining if the data rate and/or latency are at a minimum may consider the minimum acceptable data rate and minimum acceptable latency from multiple subscribers.

Returning to the above example, if subscriber 1 314 and subscriber N 318 both subscribe to the same published data but subscriber 1 314 has a minimum acceptable data rate of 50 Hz and subscriber N 318 has a minimum acceptable data rate of 20 Hz, the example process 800 may only consider the higher minimum acceptable data rate of 50 Hz. Likewise, if subscriber 1 314 has a minimum acceptable latency of 0-15 ms and subscriber N 318 has a minimum acceptable data rate of 0-20 ms, the example process 800 may only consider the shorter minimum acceptable data rate of 0-15 ms. In this instance only the higher minimum acceptable data rate and/or shorter minimum acceptable latency may be considered because the data for both subscribers is transmitted as a single unit through the affected portion of the network. If the published data is kept as a single data transmission and reduced to 20 Hz or the latency extended to 20 ms, subscriber 1 314 would not receive the data at the specified minimum QoS.

As an alternative, the published data may be separated into two data paths so that it can be transmitted at different rates and/or latencies to the different subscribers. In this example, it would be unlikely that the data published from publisher 1 would be separated into multiple data paths because it would result in the same data traversing a large percentage of the network multiple times. However, if the segment of the network in which the anomaly occurs is closer to the delivery side of the network, such as node 606(6), the example process 800 may determine that the data paths for the published data may be separated for delivery to subscriber 1 314 and subscriber N 318 without undue load on the network. For example, the data paths may be separated at node 606(5) and the data rate for subscriber 1 314 reduced to the minimum acceptable rate and routed through the affected node 606(6) while data for subscriber N 318 is separated at node 606(5) and rerouted through other nodes within the network at the desired data rate.

Returning to the example process 800, if it is determined that the lower priority subscription is at a minimum data rate and/or minimum latency for the subscriber, the example process 800 returns to block 818 and identifies the next lowest priority subscription, again considering the applied mode(s). However, if it is determined that the data rate and/or latency for the subscriber are not at a minimum, the data rate and/or latency may be reduced for the lower priority subscription, as in 822. As discussed above, the rate of data delivery for different subscriptions may be reduced by one or more nodes within the data path filtering out data packets. Additionally, if there are multiple subscribers receiving the same data from the same path, the data rate may only be reduced to the highest minimum acceptable rate for those subscribers. In still other instances, if there are multiple low priority subscriptions, the data rate for each may be reduced until the anomaly is resolved or it can be managed without further reduction of data rates. For example, if there are three low priority subscriptions identified, rather than reducing one subscription from the desired data rate to the minimum acceptable data rate, the data rate for each of the three subscriptions may be reduced a smaller amount.

In a similar manner, the latency for different subscriptions may be modified by, for example, one or more nodes within the data path processing and forwarding higher priority data before lower priority data. Additionally, if there are multiple subscribers receiving the same data from the same path, the latency may only be modified to the shortest minimum acceptable rate for those subscribers. In still other instances, if there are multiple low priority subscriptions, the latency for each may be reduced until the anomaly is resolved or it can be managed without further modification of latency. For example, if there are three low priority subscriptions identified, rather than modifying the latency of one subscription from the desired latency to the minimum acceptable latency, the latency for each of the three subscriptions may be modified a smaller amount.

Upon modifying the QoS (data rate and/or latency) of the lower priority subscription, the example process 800 may confirm whether the anomaly affecting the impacted segment of the network is manageable without further QoS reductions for other subscriptions or if additional changes are needed. Specifically, the example process 800 may return to decision block 806 and continue until either the anomaly is resolved or becomes manageable without further QoS reductions. In this example, the example process may return to decision block 806 and if it is determined that the anomaly is not manageable without further QoS reductions, it may again be determined whether one or more modes need to be applied to some or all of the priorities. Alternatively, the previously determined and applied mode(s) may continue to be utilized in identifying the next lowest priority subscription for which the rate is to be reduced.

FIG. 9 is a flow diagram of an example process for correcting a data path interruption for a subscription, in accordance with one implementation. The example process 900 begins upon detecting the data path interruption for a subscriber that is subscribing to published data within the network, as in 902. A data path interruption may result from a failure of the network or other physical interruption. For example, one or more nodes within the network may temporarily or permanently fail due to power, hardware and/or software problems. As discussed above, data paths for multiple subscriptions (for the same or different data) may traverse the same nodes within the network. As such, the example process 900 may be utilized for each interrupted data path.

Upon detecting a data path interruption, a determination is made as to whether one or more alternative data paths are defined and available for the subscription, as in 904. If there are one or more alternative data paths defined and available for the subscription, an alternative data path is selected and utilized, as in 906. In some implementations, if multiple alternative data paths are defined and available for a subscription, the example process 900 may consider whether other subscribers are subscribing to the same data. For example, if three subscribers are subscribing to the same published data, the example process may consider each alternative data path defined for those subscribers and select the alternative data path that is common to the majority of the subscribers. As part of utilizing an alternative data path, the example process may update the routing rules that are maintained by each node within the network so that the data traffic is rerouted according to the defined and selected alternative data path. Upon selecting and utilizing an alternative data path to reroute the data, the example process completes as a 908.

If it is determined at decision block 904 that no alternative data paths are defined or available, a determination may be made as to whether an undefined alternative data path is potentially available, as in 910. Undefined alternative data paths may be identified by continuous monitoring of the network and through selection of segments of the network with additional capacity that will still allow delivery of the data within the desired latency. If it is determined that an undefined alternative data path is potentially available, the example process 900 may define and utilize the alternative data path, as in 912. Similar to defining an alternative data path when a subscription is created, the undefined alternative data path may be dynamically defined for each network segment from the publisher to the subscriber and routing rules updated within the nodes to ensure that the data is properly transmitted to the subscriber with the desired QoS. Upon defining and utilizing a previously undefined alternative data path and rerouting the data through the alternative data path, the example process 900 completes, as in 908.

If it is determined at decision block 910 that no alternative data paths are available (defined or undefined) a potential data path with the lowest priority subscription is identified, as in 914. As discussed above, identifying the lowest priority subscription may be done systematically. For example, multiple potential alternative data paths may be identified such that, if available capacity existed, the data could be delivered to the subscriber at least at the minimum QoS for that subscriber.

The priority from multiple subscribers may be considered when identifying a lower priority subscription. For example, if multiple subscribers (i.e., two or more subscribers) are subscribing to the data and the data is routed for those subscribers as a single data transmission along the segment of the network for which QoS reduction may occur, the example process 900 may consider only the highest priority for those subscriptions.

Upon identifying a lower priority subscription, a determination is made as to whether the QoS (data rate and/or latency) for that subscription is already at a minimum, as in 914. For example, it may be determined if the data rate is already at a minimum acceptable data rate and/or weather the latency is already at a minimum acceptable latency. As discussed above, subscribers may identify a desired data rate for a subscription, a minimum acceptable data rate for the subscription, a desired latency, a minimum acceptable latency and a priority for each subscription. Determining if the data rate is at a minimum may consider the minimum acceptable data rate and minimum acceptable latency from multiple subscribers.

For example, if subscriber 1 314 and subscriber N 318 both subscribe to the same published data but subscriber 1 314 has a minimum acceptable data rate of 50 Hz and subscriber N 318 has a minimum acceptable data rate of 20 Hz, the example process 900 may only consider the higher minimum acceptable data rate of 50 Hz. Likewise, if subscriber 1 314 has a minimum acceptable latency of 0-15 ms and subscriber N 318 has a minimum acceptable data rate of 0-20 ms, the example process 700 may only consider the shorter minimum acceptable data rate of 0-15 ms. In this instance only the higher minimum acceptable data rate and/or shorter minimum acceptable latency may be considered because the data for both subscribers is transmitted as a single unit through the affected portion of the network. If the published data is kept as a single data transmission and reduced to 20 Hz or the latency extended to 20 ms, subscriber 1 314 would not receive the data at the specified minimum QoS.

As an alternative, the published data may be separated into two data paths so that it can be transmitted at different rates and/or latencies to the different subscribers. In this example, it would be unlikely that the data published from publisher 1 would be separated into multiple data paths because it would result in the same data traversing a large percentage of the network multiple times. However, if the segment of the network in which the anomaly occurs is closer to the delivery side of the network, such as node 606(6), the example process 900 may determine that the data paths for the published data may be separated for delivery to subscriber 1 314 and subscriber N 318 without undue load on the network. For example, the data paths may be separated at node 606(5) and the data rate for subscriber 1 314 reduced to the minimum acceptable rate and routed through the affected node 606(6) while data for subscriber N 318 is separated at node 606(5) and rerouted through other nodes within the network at the desired data rate.

If it is determined that the lower priority subscription is at a minimum data rate and/or minimum latency for the subscriber, the example process 900 returns to block 914 and identifies the next lowest priority subscription. However, if it is determined that the data rate and/or latency for the subscriber are not at a minimum, the data rate and/or latency may be reduced for the lower priority subscription, as in 918. As discussed above, the rate of data delivery for different subscriptions may be reduced by one or more nodes within the data path filtering out data packets. Additionally, if there are multiple subscribers receiving the same data from the same path, the data rate may only be reduced to the highest minimum acceptable rate for those subscribers. In still other instances, if there are multiple low priority subscriptions, the data rate for each may be reduced until the anomaly is resolved or it can be managed without further reduction of data rates. For example, if there are three low priority subscriptions identified, rather than reducing one subscription from the desired data rate to the minimum acceptable data rate, the data rate for each of the three subscriptions may be reduced a smaller amount.

In a similar manner, the latency for different subscriptions may be modified by, for example, one or more nodes within the data path processing and forwarding higher priority data before lower priority data. Additionally, if there are multiple subscribers receiving the same data from the same path, the latency may only be modified to the shortest minimum acceptable rate for those subscribers. In still other instances, if there are multiple low priority subscriptions, the latency for each may be reduced until the anomaly is resolved or it can be managed without further modification of latency. For example, if there are three low priority subscriptions identified, rather than modifying the latency of one subscription from the desired latency to the minimum acceptable latency, the latency for each of the three subscriptions may be modified a smaller amount.

Upon modifying the QoS (data rate and/or latency) of the lower priority subscription, the example process 900 returns to decision block 910 and determines if an alternate data path is now potentially available such that the data may be rerouted and still delivered at a QoS that at least meets the minimum QoS for the subscriber(s) to the published data.

FIG. 10 is a flow diagram of an example process 1000 for adjusting the rate at which data is delivered to subscribers within the network, according to one implementation. The example process 1000 begins upon detecting available capacity within the network, as in 1002. Available capacity may result from the correction of an anomaly, reduced data traffic, expanded network capabilities or infrastructure, etc.

Upon detecting available capacity, a determination is made as to whether there is a subscriber currently receiving data at a QoS below the desired QoS, as in 1004. If it is determined that there are no subscribers currently receiving data below the desired QoS, the process completes, as in 1012.

However, if it is determined that there is a subscriber currently receiving data below the desired QoS, the subscriber with the highest priority subscription that is receiving data below the desired QoS is identified, as in 1006. A determination is then made as to whether sufficient capacity (e.g., bandwidth or compute capacity) exists along the data path to increase the data rate and/or shorten the latency to the desired data rate and/or desired latency of the subscriber, as in 1008. If it is determined that sufficient capacity exists, the data rate and/or latency is modified, as in 1010, and the process completes, as in 1012. In one implementation, the data rate may be increased by the system management component modifying the filtering rules maintained on the nodes within the network to reduce the amount of data that is filtered along the data path. Likewise, latency may be reduced by the system management component modifying an order in which processing of data through the nodes is performed, such that the lower priority data is processed in the same order as other data.

If it is determined that sufficient capacity along the active data path does not exist to allow the QoS to be increased to that of the desired QoS, a determination is made as to whether sufficient capacity exists on an alternative data path defined for the subscription such that the data may be transmitted along the alternative data path at the desired QoS, as in 1014. If sufficient capacity exists along a defined alternative data path, the data is rerouted along the alternative data path from the publisher to the subscriber, as in 1016, and the QoS increased to correspond with the desired QoS of the subscriber, as in 1010.

If it is determined that sufficient capacity does not exist on a defined alternative data path, the example process 1000 determines which data path defined for the subscription has the highest available capacity, as in 1018. Upon determining which of the defined data paths for the subscription has the highest available capacity, the example process 1000 may reroute the data to the determined data path, as in 1020 and increase the QoS until capacity is reached, as in 1010. Upon rerouting the data and increasing the QoS, the example process 1000 completes, as in 1012. In some implementations, the example process 1000 may also determine if there is an undefined data path that is potentially available such that if the data is routed to that defined path it could be provided to the subscriber according to the desired QoS. Likewise, if no data path (defined or undefined) is available that would allow delivery of the data at the desired QoS, in some implementations, the example process 1000 may consider what data path (defined or undefined) would allow the highest QoS.

Figure 11:
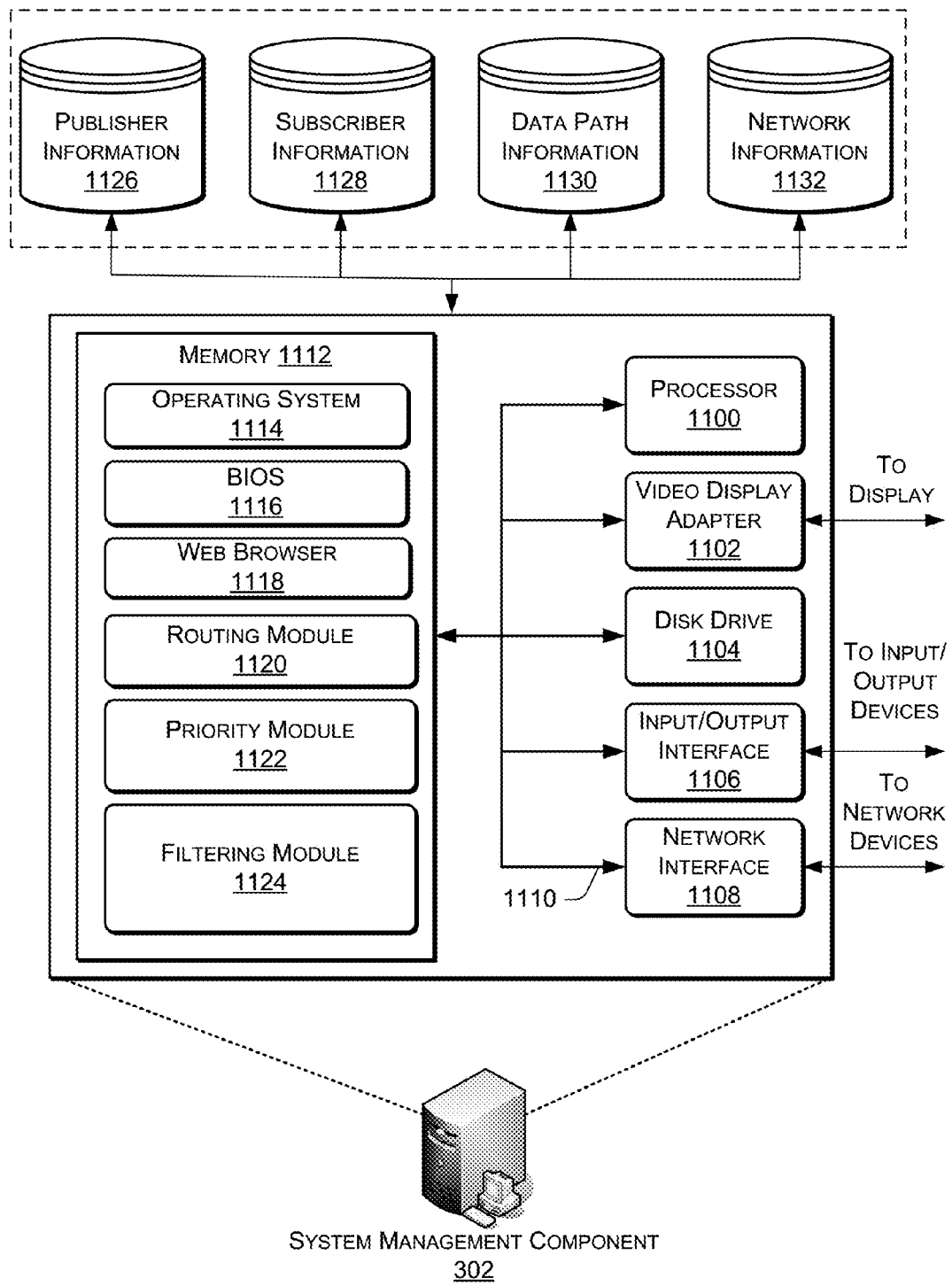
FIG. 11 is a pictorial diagram of an illustrative implementation of a system management component implemented as a server system that may be used with the various implementations.

FIG. 11 is a pictorial diagram of an illustrative implementation of a server system, such as the system management component 302, that may be used in the environments described herein. The system management component 302 may include a processor 1100, such as one or more redundant processors, a video display adapter 1102, a disk drive 1104, an input/output interface 1106, a network interface 1108, and a memory 1112. The processor 1100, the video display adapter 1102, the disk drive 1104, the input/output interface 1106, the network interface 1108, and the memory 1112 may be communicatively coupled to each other by a communication bus 1110.

The video display adapter 1102 provides display signals to a local display (not shown in FIG. 11) permitting an operator of the system management component 302 to monitor and configure operation of the system management component 302. The input/output interface 1106 likewise communicates with external input/output devices not shown in FIG. 11, such as a mouse, keyboard, scanner, or other input and output devices that can be operated by an operator of the system management component 302. The network interface 1108 includes hardware, software, or any combination thereof, to communicate with other computing devices. For example, the network interface 1108 may be configured to provide communications between the system management component 302 and other computing devices, such as publishers 308, 310, 312, subscribers 314, 316, 318 and/or nodes 306 within the network, as shown in FIGS. 3, 4 and 6.

The memory 1112 generally comprises random access memory (RAM), read-only memory (ROM), flash memory, and/or other volatile or permanent memory. The memory 1112 is shown storing an operating system 1114 for controlling the operation of the system management component 302. A binary input/output system (BIOS) 1116 for controlling the low-level operation of the system management component 302 is also stored in the memory 1112.

The memory 1112 additionally stores program code and data for providing network services that allow publishers, subscribers and nodes to exchange information and data files with the system management component 302. Accordingly, the memory 1112 may include computer executable instructions that when executed by the processor 1100, enable communication between the publishers, subscribers, nodes and the system management component. The system management component 302 communicates with the publisher to obtain publisher information, such as the publisher identification, data to be published and rate of publication that is maintained in the publisher information data store 1126. Likewise, the system management component 302, through the computer executable instructions, may communicate with subscribers to receive subscriber information, such as the subscriber identification, data for which the subscriber is subscribing, desired data rate, minimum acceptable data rate, priority and number of data paths for the subscription. This information may be maintained in the subscriber information data store 1128. The system management component 302 may also communicate with the nodes within the network to identify and maintain network information, such as network load, available capacity, connections between nodes, node processing time, etc. that is maintained in the network information data store 1132. Utilizing the publisher information, subscriber information and network information, the system management component 302 may develop and maintain data paths for each subscription, routing rules for each data path and filtering rules for each subscription. Data paths, routing rules and filtering rules may be maintained in the data path information data store 1130.

Additionally, the memory 1112 may also include a routing module 1120, a priority module 1122 and a filtering module 1124. The modules 1120-1124 may be executable by the processor 1100 to implement one or more of the functions of the system management component 302. In one implementation, each of the modules 1120-1124 may represent instructions embodied in one or more software programs stored in the memory 1112. In another implementation, the modules 1120-1124 can represent hardware, software instructions, or a combination thereof.

In some implementations, the routing module 1120 is configured to define routing instructions for each data path for each subscription and provide those routing instructions to the nodes within the network. In some implementations, the routing module 1120 may also monitor the network in real-time and identify alternative routes through which the data can be routed to avoid network overload or having to reduce the data rate for the subscription.

The priority module 1122 may be configured to coordinate with the routing module 1120 and/or the filtering module 1124 to identify which data paths for which subscriptions should be re-routed or undergo rate modification based on the current network conditions and/or power grid conditions. In some instances the priority module 1122 may only consider the priority of each subscription as provided by the subscribers. In other instances, additional factors, such as the current state of the power grid or the network may be considered when determining which subscriptions should take priority.

The filtering module 1124 may be configured to provide filtering rules to one or more of the nodes within the network based on the publisher information, subscriber information and the current network topology. In some implementations, the filtering module 1120 may also monitor the network in real-time and identify whether the data rates can be adjusted (higher or lower data rates) based on available capacity within the network.

Although the system management component 302 is illustrated in this example as a single server system, in other implementations, the system management component may be implemented over any number of local and/or remote server systems. Likewise, the publisher information 1126 data store, subscriber information 1128 data store, data path information 1130 data store and/or network information 1132 data store may be integrated with the system management component 302 or otherwise communicatively coupled with the system management component 302. For example, one or more of the publisher information 1126 data store, subscriber information 1128 data store, data path 1130 data store and/or network information 1132 data store may be located at a remote computing resource (not shown) and communicatively coupled with the system management component 302. In some implementations, the publisher information 1126 data store, subscriber information 1128 data store, data path information 1130 data store and/or network information 1132 data store may include one or more CD-RW/DVD-RW drives, hard disk drives, tape drives, or other storage devices that are utilized to store digital content and information. As used in this disclosure, the data stores may include lists, arrays, databases, and other data structures used to provide storage and retrieval of data. Likewise, while the disclosure describes multiple data stores, in some implementations the data stores may be configured as a single data store or multiple data stores.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A method comprising:
   detecting an anomaly in a data network in which a plurality of publishers publish data at published data rates and a plurality of subscribers subscribe to published data;
   identifying a lowest priority subscription among the plurality of subscribers;
   determining that a data rate for the lowest priority subscription is not below a minimum acceptable data rate for the subscription; and
   providing instructions to reduce the data rate for the lowest priority subscription.

2. A method as recited in claim 1, wherein the minimum acceptable data rate is below a corresponding published data rate.

3. A method as recited in claim 1, wherein providing instructions includes:
   providing filtering rules to at least one node within the data network to filter at least a portion of data transmitted to the subscriber associated with the lowest priority subscription.

4. A method as recited in claim 1, wherein the lowest priority subscription is identified based at least in part on a priority provided by the subscriber for the subscription.

5. A method as recited in claim 4, wherein the priority is modified based at least in part on a mode representative of at least one of a data network condition or a power grid condition.

6. A method as recited in claim 1, wherein the lowest priority subscription is identified based at least in part on a priority established by a system management component.

7. A method as recited in claim 1, wherein the data network is at least one of a power grid data network or an oil and gas data network.

8. A method performed by a computing device operatively coupled to a data network having a publisher publishing data, the method comprising:
   detecting an anomaly affecting a segment of the data network;
   identifying a first subscriber receiving the published data from the publisher transmitted along a data path passing through the segment of the data network affected by the detected anomaly;
   identifying a second subscriber (i) with a low priority and (ii) receiving the published data at a quality of service above a minimum quality of service associated with the second subscriber; and
   providing an instruction to the data network to reduce the quality of service of the identified second subscriber with the low priority in response to the detected anomaly affecting the segment of the data network.

9. The method of claim 8, wherein the second subscriber is also receiving the published data transmitted along a data path passing through the segment of the data network affected by the detected anomaly.

10. The method of claim 8, wherein the second subscriber is receiving the published data transmitted along another data path passing through the segment of the data network affected by the detected anomaly, and wherein the second subscriber has a lower priority than the first subscriber.

11. The method of claim 8, wherein the second subscriber is receiving the published data transmitted along another data path that does not pass through the segment of the data network affected by the detected anomaly, and wherein the second subscriber has a lower priority than first subscriber.

12. The method of claim 11, further comprising:
   rerouting at least a portion of the published data transmitted via the data network along the data path to correspond with at least a portion of the another data path that does not go through the segment of the data network affected by the detected anomaly.

13. The method of claim 8, wherein identifying the second subscriber includes identifying a plurality of second subscribers each receiving the published data at a quality of service above a minimum quality of service associated with each respective second subscribers, and wherein providing the instruction to the data network to reduce the quality of service includes providing instructions to the data network to reduce the quality of service of each of the plurality of second subscribers.

14. The method of claim 8, wherein the second subscriber is identified based at least in part on a priority associated with the second subscriber.

15. The method of claim 8, wherein the second subscriber is identified based at least in part on a priority defined by a system management component.

16. The method of claim 8, wherein the data network is associated with a power grid, and wherein a priority of the second subscriber is modifiable based at least in part on at least one of a condition of the data network or a condition of the power grid.

17. The method of claim 16, wherein the data network includes a plurality of network nodes interconnecting the publisher and the first and second subscribers, and wherein the method further includes providing instructions to the individual network nodes to receive the published data from the publisher at a first data rate and to transmit the received published data to the first or second subscribers at a second data rate different than the first data rate.

18. The method of claim 8, wherein:
the data network includes a plurality of network nodes interconnecting the publisher and the first and second subscribers; and
the method further includes providing filtering rules to at least one of the network nodes in the data network to filter at least a portion of the published data transmitted to the first or second subscribers via the data network.

19. A method of transmitting data between a publisher and a subscriber via a data network having a plurality of network nodes interconnecting the publisher and the subscriber, the method comprising:
receiving, from the publisher, a notification from the publisher regarding availability of the published data at a publishing data rate;
receiving, from the subscriber, a subscription request for receiving the published data at a subscription quality of service ("QoS") level;
defining a network path through the data network for delivering the published data from the publisher to the subscriber based on both the publishing data rate and the subscription QoS level; and
providing forwarding rules to the individual network nodes to route the published data to the subscriber along the defined network path in the data network.

20. The method of claim 19 wherein defining the network path includes defining a network path along which transmission of the published data satisfies the subscription QoS level.

21. The method of claim 19 wherein the subscription QoS level includes at least one of a data rate, a latency, or an availability, and wherein defining the network path includes defining a network path along which transmission of the published data satisfies the at least one of a data rate, a latency, or an availability of the subscription QoS level.

22. The method of claim 19 wherein:
the subscription QoS level includes a subscription data rate lower than the publishing data rate; and
the method further includes providing rate filtering rules to the individual network nodes to filter out undesired data from the published data.

23. The method of claim 19 wherein:
the subscription QoS level includes a subscription data rate lower than the publishing data rate; and
the method further includes providing rate filtering rules to the individual network nodes to filter out undesired data from the published data.

24. The method of claim 19 wherein:
the subscriber is a first subscriber associated with a first subscription QoS level;
the network path is a first network path;
the forwarding rules are first forwarding rules; and
the method further includes:
receiving, from a second subscriber, a subscription request for receiving the published data at a second subscription QoS level;
defining a second network path through the data network for delivering the published data from the publisher to the second subscriber based on both the publishing data rate and the second subscription QoS level different than the first subscription QoS level; and
providing second forwarding rules to the individual network nodes to route the published data to the second subscriber along the defined second network path in the data network.

25. The method of claim 24, further comprising:
detecting a network condition in the data network; and
in response to the detected network condition,
determining if the second subscription QoS level is above a QoS threshold;
in response to determining that the second subscription QoS level is above the QoS threshold,
reducing the second subscription QoS level to a third subscription level above the QoS threshold;
defining a third network path through the data network for delivering the published data from the publisher to the second subscriber based on both the publishing data rate and the third subscription QoS level; and
providing third forwarding rules to the individual network nodes to route the published data to the second subscriber along the defined third network path in the data network.

26. The method of claim 24 wherein:
the first subscriber is associated with a first priority level;
the second subscriber is associated with a second priority level; and
the method further includes:
detecting a network condition in the data network; and
in response to the detected network condition, determining if the first priority level is higher than the second priority level;
in response to determining that the first priority level is higher than the second priority level,
reducing the second subscription QoS level to a third subscription level;
defining a third network path through the data network for delivering the published data from the publisher to the second subscriber based on both the publishing data rate and the third subscription QoS level; and
providing third forwarding rules to the individual network nodes to route the published data to the second subscriber along the defined third network path in the data network.

27. The method of claim 24 wherein:
the first network path passes through a first segment of the data network;
the second network path passes through a second segment of the data network, the first and second segments being different from each other; and
the method further includes:
detecting a network condition in the data network; and
in response to the detected network condition, modifying the first network path to pass through the second segment of the data network.

* * * * *